(12) United States Patent
Sato et al.

(10) Patent No.: US 6,486,551 B1
(45) Date of Patent: Nov. 26, 2002

(54) WIRED BOARD AND METHOD OF PRODUCING THE SAME

(75) Inventors: Kazuhisa Sato, Aichi (JP); Hiroyuki Hashimoto, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/340,672

(22) Filed: Jun. 29, 1999

(51) Int. Cl.⁷ .................... A01L 23/48; A01L 23/52; A01L 29/40
(52) U.S. Cl. .................. 257/737; 257/738; 438/612; 438/613; 438/614; 438/615; 438/617; 228/180.21; 228/180.22
(58) Field of Search ................ 438/612–615, 438/617; 228/180.1, 180.21, 180.22; 257/737, 738

(56) References Cited

U.S. PATENT DOCUMENTS

| | | | |
|---|---|---|---|
| 4,626,479 A | | 12/1986 | Hosoi et al. ............... 428/663 |
| 5,132,185 A | * | 7/1992 | Iacovangelo ............... 428/610 |
| 5,169,680 A | * | 12/1992 | Ting et al. ................. 427/96 |
| 5,757,071 A | * | 5/1998 | Bhansali .................... 257/697 |
| 5,838,089 A | | 11/1998 | Itai et al. ................... 257/766 |
| 5,893,725 A | * | 4/1999 | Bhansali .................... 438/108 |
| 6,335,104 B1 | * | 1/2002 | Sambucetti et al. ........ 428/615 |
| 6,362,089 B1 | * | 3/2002 | Molla et al. ................ 438/612 |
| 6,383,269 B1 | * | 5/2002 | Toben et al. ............... 106/1.23 |

FOREIGN PATENT DOCUMENTS

| | | | | |
|---|---|---|---|---|
| EP | 0 654 818 A1 | 5/1995 | ........... | H01L/21/48 |
| JP | 59-6365 | 1/1984 | ........... | C23C/3/02 |
| JP | 60-56073 | 4/1985 | ........... | C23C/28/00 |
| JP | 61-104085 | 5/1986 | ........... | C23C/18/52 |
| JP | 61-239651 | 10/1986 | ........... | H01L/23/12 |
| JP | 1-303789 | 12/1989 | ........... | H05K/3/24 |
| JP | 6-264284 | 9/1994 | ........... | C25D/5/10 |
| JP | 6-84546 | 10/1994 | ........... | C23C/18/52 |
| JP | 6-283623 | 10/1994 | ........... | H01L/23/12 |
| JP | 7-193166 | 7/1995 | ........... | H01L/23/12 |
| JP | 9-260536 | 10/1997 | ........... | H01L/23/12 |
| JP | 9-283878 | 10/1997 | ........... | H05K/1/09 |

* cited by examiner

Primary Examiner—David L. Talbott
Assistant Examiner—David A. Zarneke
(74) Attorney, Agent, or Firm—Sughrue Mion, PLLC

(57) ABSTRACT

A wired board comprises a plurality of bonding pads for connection to connecting terminals of an electronic part, and a plurality of external connection terminals for connection to connecting terminals of an external circuit board such as a motherboard. Each of the bonding pads has a metallized layer, and further has a Ni—B-plated layer, a Ni—P-plated layer and a Au-plated layer which are formed in this order on the metallized layer. The Au-plated layer has the thickness ranging from 1.2 to 3.5 μm. Each of the external connection terminals has a metallized layer, and further has a Ni—B-plated layer and a Au-plated layer which are formed in this order on the metallized layer of each of the external connection terminals. The Au-plated layer of each of the external connection terminals has the thickness ranging from 0.01 to 1 μm. A method of producing the wired board is also provided.

2 Claims, 6 Drawing Sheets

WIRED BOARD AND METHOD OF PRODUCING THE SAME

BACKGROUND OF THE INVENTION

1. Field of the Invention

The present invention relates to a wired board such as a base for an IC (integrated circuit) package for hermetically sealing an electronic part such as an IC chip, and more particularly to a wired ceramic board of the type for bonding thereto an electronic part by the wire bonding technique. The present invention further relates to a method of producing a wired ceramic board of the above described type.

2. Description of the Related Art

A wired ceramic board (hereinafter will be referred to as wired board) constituting an IC package base or the like includes a plurality of bonding pads for bonding thereto an electronic part and a plurality of external connection terminals for connection to an external circuit board such as a motherboard or printed circuit board. The bonding pads and the external connection terminals include metallized layers which are formed from a high melting point metal paste which is printed onto ceramic green sheets and sintered together with the laminated green sheets. Such metallized layers constituting the bonding pads and the external connection terminals are usually coated with a non-electrolytic Ni-plated layer and further with a non-electrolytic Au-plated layer for the purpose of preventing their oxidation. The non-electrolytic plating technique is used for the reason that the metallized layers in this kind of wired board are electrically independent or separated. This kind of wired board has a die-attach surface to which an electronic part is attached by the wire bonding technique. More specifically, by such a wire bonding technique, a number of connecting terminals (i.e., electrodes) of the electronic part and a number of bonding pads (i.e., electrodes) of the wired board are bonded to each other by means of wires (i.e., metallic thin wires made of gold or aluminum and sometimes called bonding wires). One method of connecting such a wired board having mounted thereon an electronic part to a motherboard or the like circuit board is a so-called PGA (Pin Grid Array) joint. In the PGA joint, a number of connecting terminals arranged in a grid-pattern on the rear surface of the wired board are connected with pins, respectively. The pins are inserted into sockets provided to the motherboard to be received thereby. Another is a so-called LGA (Land Grid Array) joint. In the LGA joint, a number of connecting terminals (hereinafter will be referred to as LGA pads) on the rear surface of the wired board are mechanically pressed against the respective connecting terminals of the motherboard by way of fixing devices such as clips.

A disadvantage of the PGA or LGA type wired board is that it requires sockets or the like fixing means and therefore a complicated joint structure, thus increasing the cost of its connection to the motherboard. Another disadvantage is that it is large in size and requires a relatively large wire length for its connection, so it is disadvantageous from the point of view of inductance.

In place of such PGA or LGA joint, it has been proposed to utilize a BGA (Ball Grid Array) solder joint for soldering the wired board to the motherboard even if the wired board is of the type for connecting thereto an electronic part by the wire bonding technique.

In this type of wired board, the bonding pads for connection to an electronic part by the wire bonding technique needs to have a relatively thick Au-plated layer for attaining a desired bonding or solder joint between the pads and the wires. However, if the bonding pads are Au-plated so as to have a sufficiently thick Au-plated layer together with the external connection terminals for connection to an external circuit board, there arises a problem in that a thick Au-plated layer on the external connection terminals is causative of a considerable amount of intermetallic compound at the time of soldering of the external connection terminals to the external circuit board such as a motherboard, thus lowering the strength of the solder joint and therefore the reliability of same. On the contrary, if the external connection terminals are Au-plated so as to have properly thin Au-plated layers together with the bonding pads, there arises a problem in that the bonding pads with such thin Au-plated layers cannot attain desired wire bonding.

SUMMARY OF THE INVENTION

It is accordingly an object of the present invention to provide a novel and improved wired board of the type adapted for connection to an electronic part by wire bonding and for connection to an external circuit board such as a motherboard by soldering (BGA bonding), which can attain a highly reliable electrical connection by both of the wire bonding and the BGA bonding.

It is a further object of the present invention to provide a method of producing a wired board of the foregoing character.

To achieve the foregoing objects, the present invention provides a wired board which comprises a substrate, a plurality of bonding pads formed on the substrate for connection to connecting terminals of an electronic part, a plurality of external connection terminals formed on the substrate for connection to connecting terminals of an external circuit board. Each of the bonding pads has a metallized layer formed on the substrate, and further has a Ni—B-plated layer, a Ni—P-plated layer and a Au-plated layer which are formed in this order on the metallized layer. The Au-plated layer has the thickness ranging from 1.2 to 3.5 $\mu$m. Each of the external connection terminals has a metallized layer formed on the substrate, and further has a Ni—B-plated layer and a Au-plated layer which are formed in this order on the metallized layer of each of the external connection terminals. The Au-plated layer of each of the external connection terminals has the thickness ranging from 0.01 to 1 $\mu$m.

The present invention further provides a method of producing a wired board having a substrate, a plurality of bonding pads formed on the substrate for connection to connecting terminals of an electronic part, and a plurality of external connection terminals formed on the substrate for connection to connecting terminals of an external circuit board, each of the bonding pads having a metallized layer formed on the substrate and each of the external connection terminals having a metallized layer formed on the substrate. The method comprises the steps of Ni—B-plating the metallized layer of each of the bonding pads and the metallized layer of each of the external connection terminals so as to form Ni—B-plated layers thereon, respectively, Au-plating the Ni—B-plated layers so as to form thereon Au-plated layers of the thickness ranging from 0.01 to 1 $\mu$m, masking, after the step of the Au-plating, the external connection terminals so as to protect the external connection terminals from plating, removing the Au-plated layer formed on the Ni—B-plated layer of each of the bonding pads, Ni—P-plating the Ni—B-plated layer of each of the bonding pads so as to form thereon a Ni—P-plated layer, and Au-plating the Ni—P-plated layer of each of the bonding pads so as to form thereon a Au-plated layer having the thickness ranging from 1.2 to 3.5 µm.

DETAILED DESCRIPTION OF THE PREFERRED EMBODIMENTS

Figure 1:
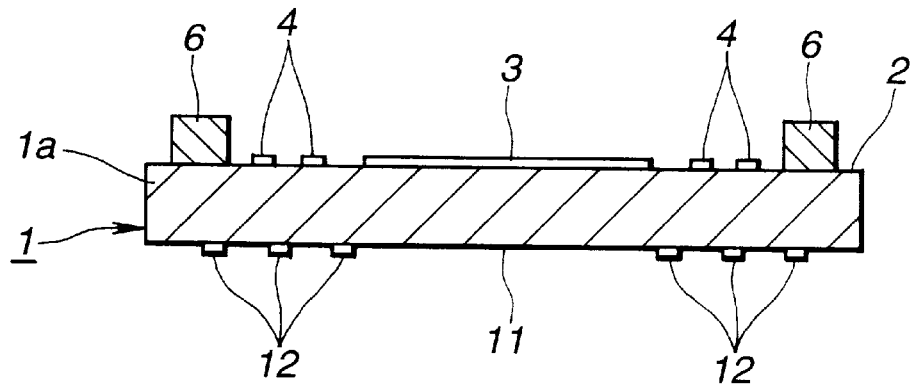
FIG. 1 is a schematic sectional view of a wired board according to an embodiment of the present invention.

Referring first to FIGS. 1 to 5, a wired board according to an embodiment of the present invention will be described. In FIG. 1, the wired board according to the present invention is generally indicated by 1. The wired board 1 is a wired multi-layered board made o f alumina ceramic and includes a ceramic substrate 1a in the form of a square plate. The ceramic substrate 1a is formed from a plurality of green sheets which are laminated, joining together by pressure and heat, and sintered. The ceramic substrate 1 has an upper surface 2 with a square central portion thereof constituting a die-attach surface 3. A number of bonding pads 4 (372 in number in this embodiment) each being quite small in size and having a square shape are arranged in the area indicated by the two-dot chain lines in FIG. 3 and in a way as to surround the die-attach surface 3 though only some of the bonding pads 4 are shown. The die-attach surface 3 includes a metallized layer 3a formed on the surface 2 of the ceramic substrate 1a. The die-attach surface 3 further includes a 2.5 µm thick non-electrolytic Ni—B-plated layer 3b, a 2.5 µm thick non-electrolytic Ni—P-plated layer 3c, and a 2.0 µm thick non-electrolytic Au-plated layer 3d which are formed in this order on the metallized layer 3a. Similarly, each bonding pad 4 includes a metallized layer 4a formed on the surface 2 of the ceramic substrate 1a. Each bonding pad 4 further includes a 2.5 µm thick non-electrolytic Ni—B-plated layer 4b, a 2.5 µm thick non-electrolytic Ni—P-plated layer 4c, and a 2.0 µm thick non-electrolytic Au-plated layer 4d which are formed in this order on the metallized layer 4a.

Further, in this embodiment, a metallized layer 5a in the form of a square ring of a predetermined width is formed on the surface 2 of the ceramic substrate 1a in a way as to surround the array of bonding pads 4. On the metallized surface 5a is formed a 2.5 µm thick non-electrolytic Ni—B-plated layer 5b to which is soldered a square ring 6 made of kovar and having a rectangular cross section. Inside of the square ring 6 is defined a cavity which serves as an electronic part receiving section. On the square ring 6 soldered to the substrate 1a are formed a 2.5 µm thick non-electrolytic Ni—P-plated layer 5c and a 2.0 µm thick non-electrolytic Au-plated layer 5d in this order. The upper or front surface 2 side of the substrate 1a is thus constructed so that an electronic part 7 is attached to the die-attach surface 3, connection terminals (not shown) of the electronic part 7 and the bonding pads 4 are bonded to each other by wires 8 and thereafter a lid 9 is placed on the upper surface of the rectangular ring 6 so as to hermetically seal the electronic part 7 by seam weld.

Figure 4:
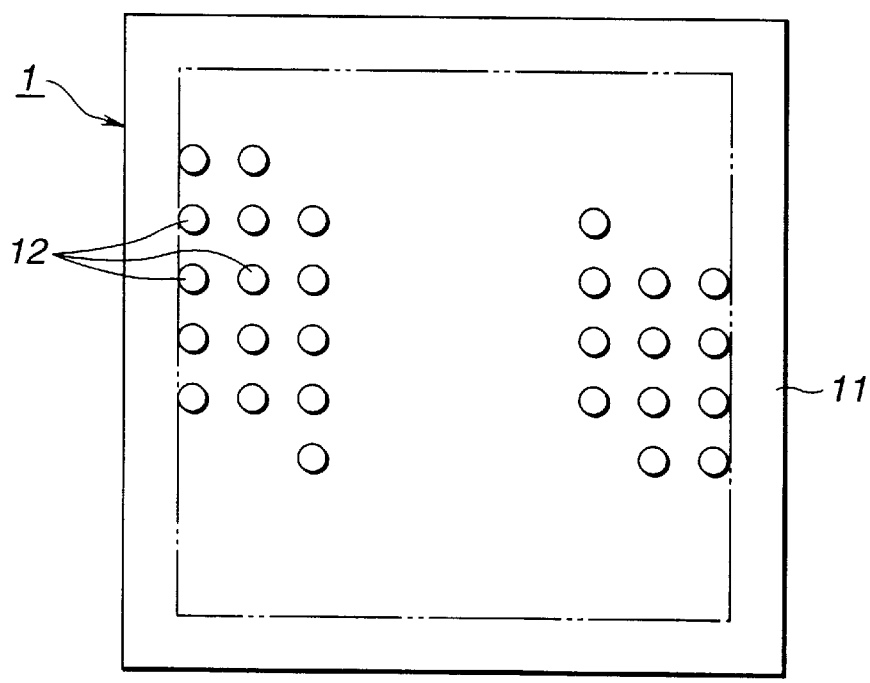
FIG. 4 is a rear view of the wired board of FIG. 1, with some of external connection terminals being omitted for brevity.

On the other hand, arranged on the lower or rear surface 11 of the substrate 1a are a number of (e.g., 324) external connection terminals (BGA pads) 12 in vertical and horizontal rows within an area indicated by the two-dot chain lines in FIG. 4 though only some of the connection terminals 12 are shown. The external connection terminals 12 are electrically connected to the bonding pads 4 by way of internal conductors (not shown). Each of the external connection terminals (hereinafter also referred to as BGA pads) 12 includes a metallized layer 12a formed on the rear surface 11 of the substrate 1a and having a circular shape when viewed in a plan view. Each of the external connection terminals 12 further includes a 2.5 µm thick non-electrolytic Ni—B-plated layer 12b and a 0.05 µm thick non-electrolytic Au-plated layer 12d which are formed in this order on each metallized layer 12a. In the meantime, the metallized layers 3a, 4a, 5a and 12a are made of a high melting point metal such as tungsten or molybdenum and formed by screen-printing a metal paste onto a green sheet which is joined with other green sheets by pressure and sintering the printed paste together with the green sheets.

The electronic part 7 is soldered to the die-attach surface 3 of the wired board 1 with a Au—Si alloy solder. The connection terminals (electrodes) of the electronic part 7 and the bonding pads 4 are connected to teach other by wire bonding. Then, the lid 9 is disposed to cover the electronic part 7 and hermetically seal the same (refer to FIG. 5). In this connection, desired wire bonding can be attained since the Au-plated layer 4d formed on the bonding pads 4 is sufficiently thick.

Figure 2:
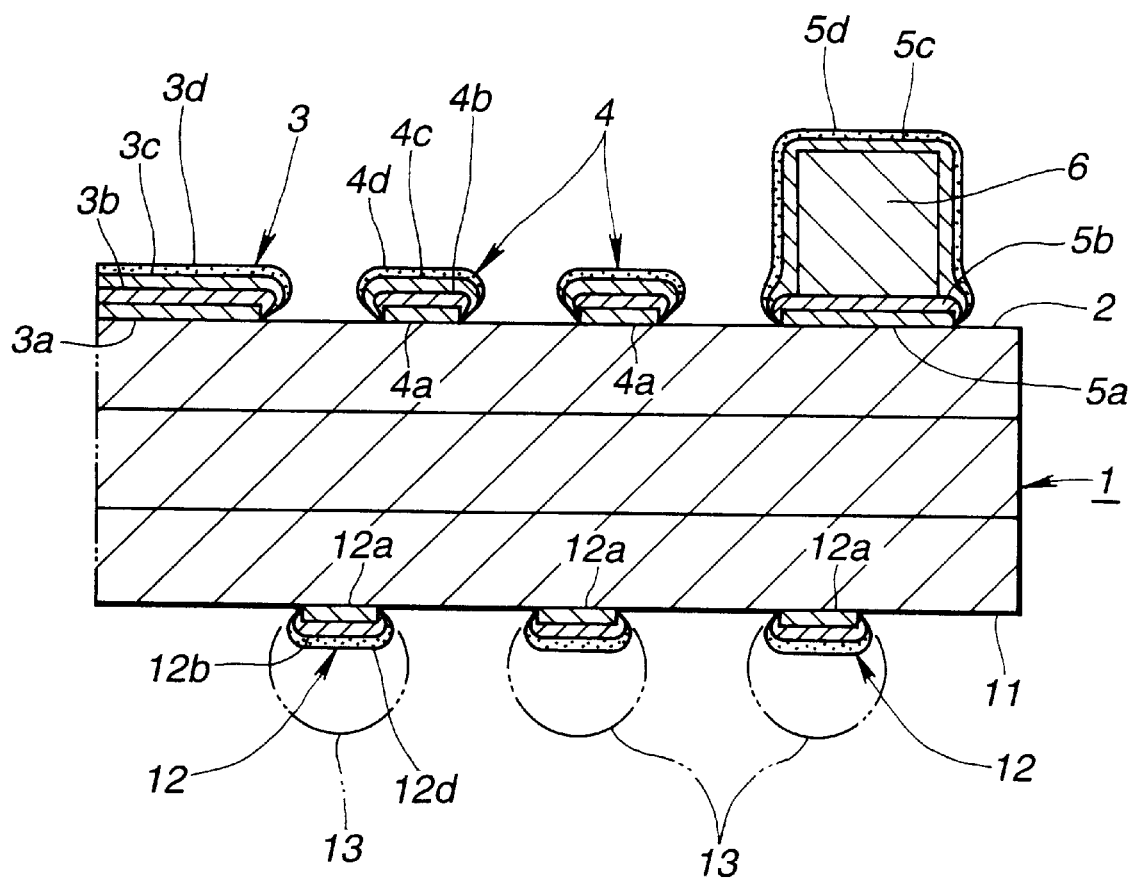
FIG. 2 is an enlarged view of an important portion of the wired board of FIG. 1.
Figure 3:
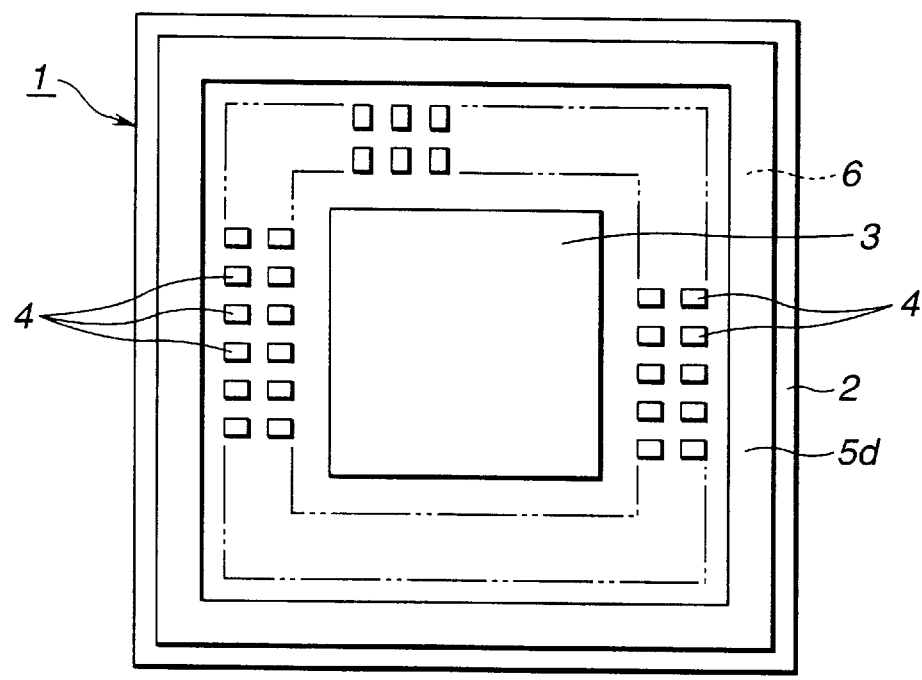
FIG. 3 is a top view of the wired board of FIG. 1, with some of bonding pads being omitted for brevity.

The wired board 1 having mounted thereon the electronic part 7 is formed with solder bumps 13 as shown by the two-dot chain lines in FIG. 2. The solder bumps 13 are formed on the BGA pads 12 in the following manner. Firstly, masses of low melting point solder such as Pb—Sn alloy solder in the state of paste are printed or otherwise applied onto the surfaces of the BGA pads 12. On the thus printed masses of low melting point solder are mounted high melting point solder balls. The masses of low melting point solder and the high melting point solder balls are subjected to heating at 220° C. for instance for reflow of only the low melting point solder. By this, the high melting point solder balls are soldered to the respective BGA pads (external connection terminals) 12 to constitute the solder bumps 13 as indicated by the two-dot chain lines in FIG. 2.

Figure 5:
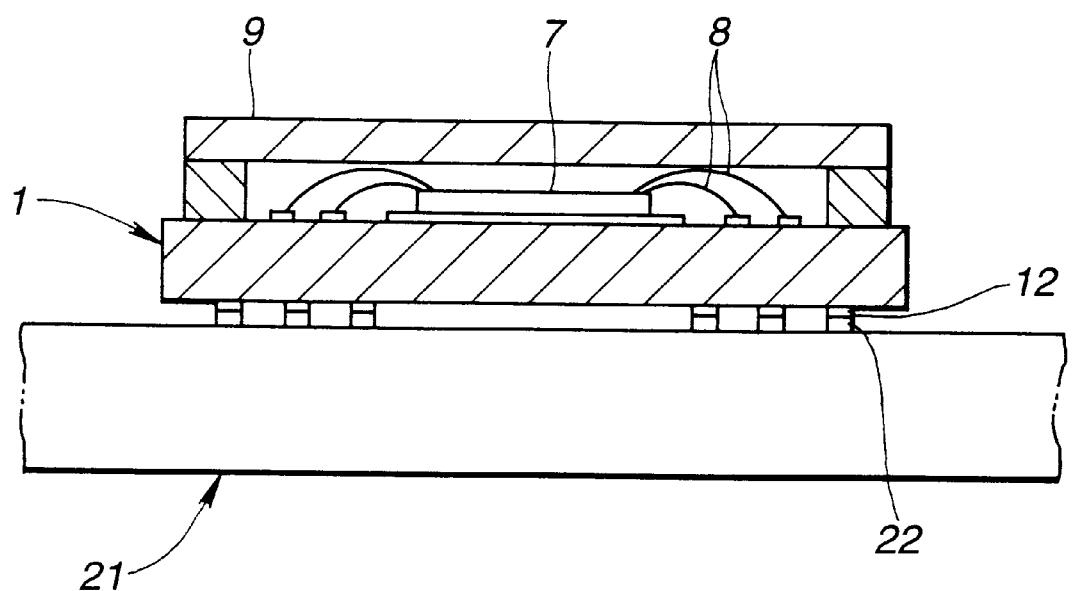
FIG. 5 is a schematic sectional view of the wired board of FIG. 1 in the state of mounting thereon an electronic part while hermetically sealing it and being bonded to a motherboard.

The wired board 1 hermetically sealing the electronic part 7 and formed with the solder bumps 13 in the above described manner is mounted onto a motherboard 21 (refer to FIG. 5) in the following manner. The motherboard 21 is a resin substrate printed circuit board and has predetermined connecting terminals 22. First, the BGA pads 12 of the wired board 1 and the connection terminals 22 of the motherboard 21 are aligned with each other and placed one upon another. The pads 12 and the terminals 22 are then soldered and thereby electrically connected to each other. FIG. 5 shows the wired board 1 in the state of being soldered to the motherboard 21.

In this joint structure, only a small amount of intermetallic compound such as Au—Sn is produced since the Au-plated layer 12d formed on the surface of each BGA pad 12 is properly thin. Thus, the strength of the solder joint and the reliability of same can be high. In the meantime, Cu balls can be used in place of the solder balls to produce the same effect.

Figure 6:
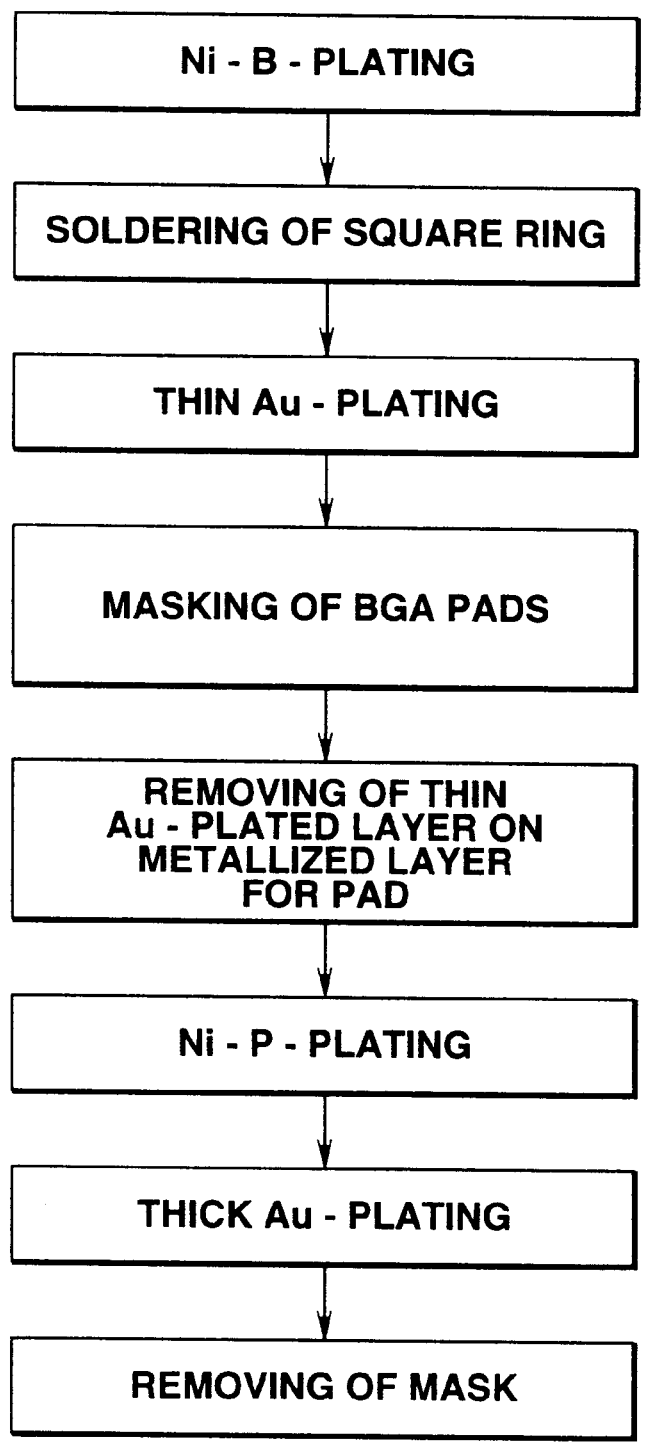
FIG. 6 is a flowchart of a plating process used for producing the wired board of FIG. 1.

Referring to FIG. 6, the method of producing the above described wired board 1 will be described. Firstly, green sheets on which predetermined patterns of metallizing paste of a high melting point metal such as tungsten is printed, respectively. The green sheets with such printed patterns are laminated and joined together by pressure, and thereafter sintered to form the ceramic substrate 1a having a number of metallized layers constituting the bonding pads 4 and the external connection terminals 12 for connection to an external circuit board such as a motherboard. Hereinbelow, description will be mainly made to the plating process for plating the metallized layers 4a and 12a constituting the bonding pads 4 and the external connection terminals 12, respectively.

All of the exposed metallized layers on the ceramic substrate 1a, such as the layers 4a and 12a constituting the bonding pads 4 and the external connection terminals 12 are Ni—B-plated non-electrolytically once or a plurality of times so as to be coated with 2.5 µm thick non-electrolytic Ni—B-plated layers, respectively. The square ring 6 made of kovar is soldered to the metallized layer 5. Then, a thin Au-plating step is performed, i.e., all of the exposed metallized layers are Au-plated non-electrolytically so as to be coated with thin Au-plated layers which are 0.05 µm thick. In this production method, the plating of the external connection terminals (BGA pads) 12 is completed at this step, so a masking tape such as an adhesive resinous tape is attached to the BGA pads 12 to mask them in a fluid-tight manner and thereby protect them from plating. The thin Au-plated layer forming the surface of each bonding pad 4 is removed by etching. Then, the Ni—B-plated layers formed on the metallized layers 4a for the bonding pads 4 are coated with a 2.5 µm thick non-electrolytic Ni—P-plated layer and then processed by a thick Au-plating step, i.e., further coated with a thick non-electrolytic Au-plated layer which is 2.0 µm thick. Thereafter, by removing the masking tape, a desired wired board 1 which has completed with the plating process is obtained. In this producing method, while the etching step is necessitated, the masking step can be once.

Figure 7:
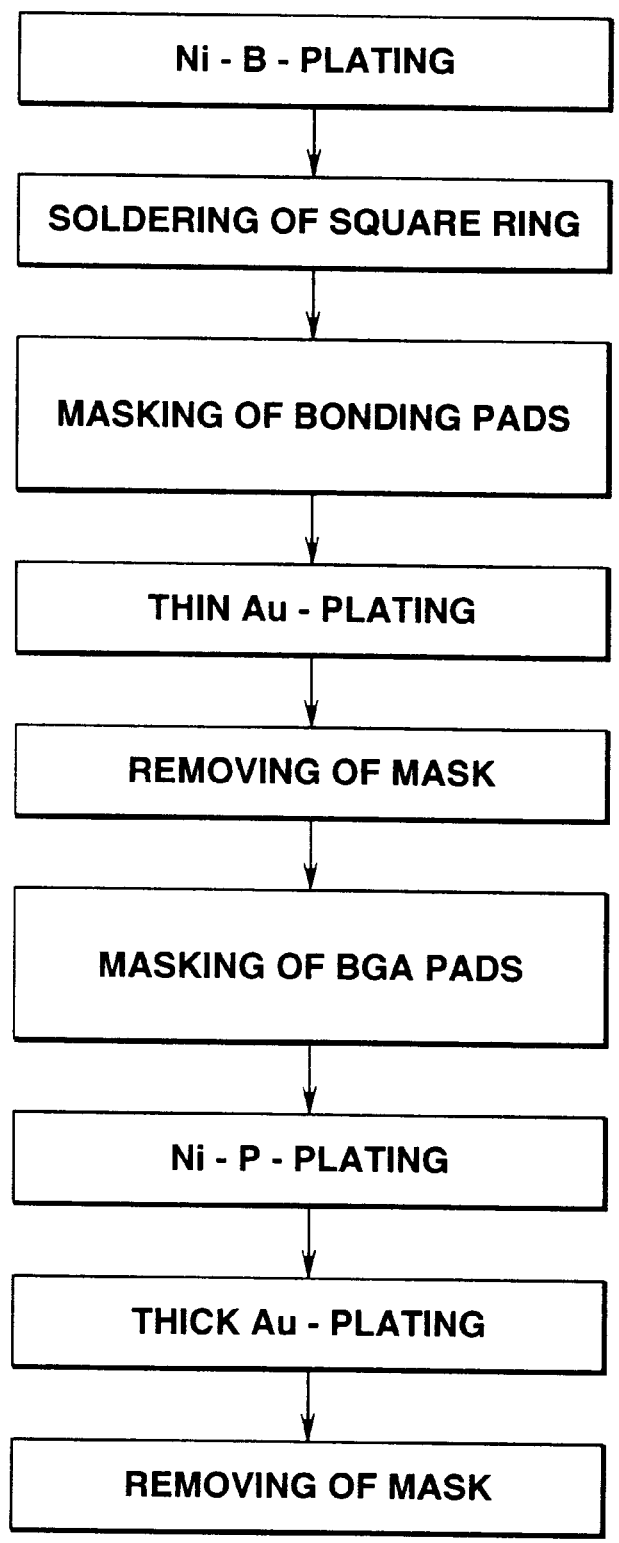
FIG. 7 is a flowchart of a modification of the plating process of FIG. 6.

The method of producing the wired board 1 is not limited to the above described one but the wired board 1 can be produced by the steps shown in FIG. 7. Firstly, all of the metallized layers constituting the bonding pads 4 and the external connection terminals 12 are Ni—B-plated non-electrolytically so as to be coated with 2.5 µm thick Ni—B-plated layers, respectively. Then, soldering of the square ring 6 for forming the cavity is performed. Similarly to the above described method, the masking is carried out so as to protect the bonding pads from plating and allow only the BGA pads (external connection terminals) to be exposed. The Ni—B-plated layers 12b formed on the metallized layers 12a for the BGA pads 12, are coated with thin Au-plated layers which are 0.05 µm thick, respectively.

The above described mask is removed, and the thin Au-plated layers 12d formed on the BGA pads 12 are masked so as to be protected from plating. The Ni—B-plated layer on each bonding pad 4 is coated with a 2.5 µm thick non-electrolytic Ni—P-plated layer and then with a thick non-electrolytic Au-plated layer. Finally, the mask is removed. By this method, an additional masking step is required but no etching step is required.

Although the invention has been described by reference to a certain embodiment, the invention is not limited to the embodiment described above. For example, the thickness of the thick Au-plated layer 4d of each bonding pad 4 is not limited to 2.0 µm but can be within the range from 1.2 to 3.5 µm to produce the same effect. That is, when the Au-plated layer 4d of each bonding pad 4 is formed so as to be thick, i.e., so as to have the thickness ranging from 1.2 to 3.5 µm, there is not caused any problem in wire bonding of the bonding pads 4 to connecting terminals of an electronic part. When the thickness is less than 1.2 µm, there can arise a problem in the wire bonding. When the thickness is more than 3.5 µm, a problem may arise in that the adherence of the Au-plated layer to the metallized layer 4a is deteriorated due to an internal stress of the Au-plated layer and the difference in thermal expansion between the Au-plated layer and the ceramic substrate 1a or the metallized layer 4a. Further, the thickness less than 3.59 µm is advantageous since the time necessary for plating can be shorter and therefore the cost can be reduced. Further, the thickness of the Au-plated layer 12d of each of the external connection terminals 12 is not limited to 0.05 µm but can be within the range from 0.01 to 1 µm. That is, when the Au-plated layer 12d is formed so as to be thin, i.e., so as to have the thickness ranging from 0.01 to 1 µm, it can prevent oxidation of the Ni—B-plated layer 12b sufficiently while allowing only a small amount of inter-metallic compound to be produced at the time of soldering, so that there is not caused almost any deterioration of the soldering of the external connection terminals 12. That is, when solder bumps or balls of Pb—Sn alloy or the like are formed on or attached to the external connection terminals 12, the gold of the Au-plated layer 12d rapidly diffuses into the solder bumps or balls to form an intermetallic compound (Au—Sn alloy). When the thickness of the Au-plated layer 12d is larger than 1 µm, a larger amount of gold diffuses into the solder bumps or balls on the external connection terminals 12 to produce a so large amount of intermetallic compound, thus reducing the joining strength at the joint between the solder bumps or balls and the external connection terminals. When the thickness of the Au-plated layer 12d is less than 1 µm, such a problem is not caused. When the thickness is less than 0.01 µm, a desired soldering of the external connection terminals cannot be attained. Although the thickness of the Au-plated layer 12d is preferably in the range from 0.01 to 1 µm, it is more preferably in the range from 0.03 to 1 µm. By the foregoing, it will be understood that although the wired board of this invention is adapted to attach thereto an electronic part by wire bonding and to be attached to connecting terminals of a motherboard by soldering, it can attain both of a desired and reliable wire bonding of an electronic part and a desired and reliable bonding thereof to a motherboard.

While the embodiment has been described and shown as to the wired board of the type in which a square ring made of kovar is soldered to form a cavity, this is not for the purpose of limitation but the present invention can be any type of wired board so long as the wired board is of the type having bonding pads to be connected to connection terminals of an electronic part and external connection terminals to be connected to connection terminals of a motherboard, wherein a Ni-plated layer and a Au-plated layer are formed in sequence on each of the metallized layers constituting the bonding pads and the external connection terminals, respectively.

Figure 8:
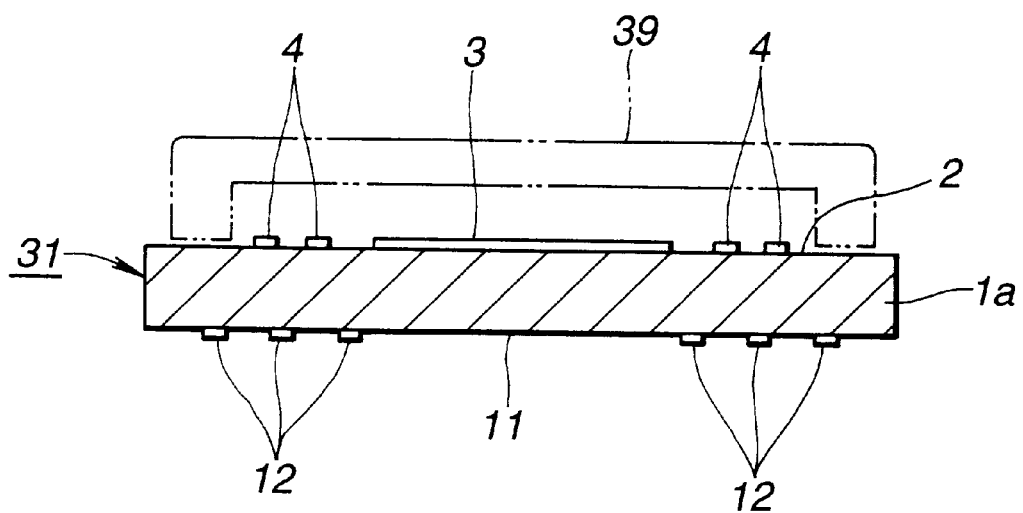
FIG. 8 is a schematic sectional view of a wired board according to another embodiment of the present invention.

FIG. 8 shows a wired board 31 according to another embodiment. This embodiment differs from the previous embodiment in that the ceramic substrate 1a is not provided with the rectangular ring 6 (refer to FIG. 1) and a lid 39 is in the form of a dish or shallow container and placed on the substrate 1a and bonded thereto by a resinous adhesive for thereby hermetically sealing an electronic part. In the method of producing this wired board 31, a square ring soldering step can be dispensed with. Except for the above, this embodiment is substantially the same as the previous embodiment.

While the present invention has been described and shown as being applied to a ceramic multi-layer wired board, it can be applied to a single layer wired board.

Further, while the wire board has been described and shown as being of the type wherein the external connection terminals are disposed on the side opposite to the die-attach surface side, the external connection terminals may be located on the same side as the die-attach surface side. Further, it is needless to say that the substrate 1a is not limited to an alumina ceramic substrate.

In the foregoing, it is to be noted that according to the present invention the bonding pads 4 have the Au-plated layers 4d of the suitable thickness, i.e., of the thickness ranging from 1.2 to 3.5 $\mu$m (i.e., thick Au-plated layers), which Au-plated layers 4d are formed on Ni-plated layers, so that the bonding pads 4 have an excellent bonding ability.

It is further to be noted that the external connection terminals 12 have the Au-plated layers 12d of the suitable thickness, i.e., of the thickness ranging from 0.01 to 1 $\mu$m (i.e., thin Au-plated layers), which Au-plated layers are formed on Ni-plated layers, so that only a small amount of intermetallic compound such as Au—Sn is produced and therefore an excellent soldering ability can be attained.

It is still further to be noted that the Ni—B-plated layers 4b which have a good adherence to the metallized layers 4a and the Ni—P-plated layers 4c which have a good adherence to the Au-plated layers 4d are used as the undercoat Ni-plated layers for the bonding pads 4 so that the bonding pads 4 are adapted to be suited for wire bonding. In this connection, the Ni—B-plated layer is a plated layer whose major constituent is a Ni—B alloy, and the Ni—P-plated layer is a plated layer whose major constituent is a Ni—P alloy.

It is yet further to be noted that the Ni—B-plated layer 12b having a good soldering ability is used as the undercoat Ni-plated layer for the external connection terminals 12 so that the external connection terminals 12 have a good bonding ability. In this connection, the reason why the external connection terminals are coated with only the Ni—B-plated layers is that the Au-plated layers of the external connection terminals are thin so that the Au-plated layers melt or diffuse readily into the solder and therefore it does matter if the undercoat Ni-plated layer has a good adherence to the Au-plated layer.

Many modifications and variations of the present invention are possible in light of the above teachings. Therefore, within the scope of the appended claims, the present invention may be practiced otherwise than as specifically described.

What is claimed is:

1. A wired board comprising:

a substrate;

a plurality of bonding pads formed on said substrate for connection to connecting terminals of an electronic part;

a plurality of external connection terminals formed on said substrate for connection to connecting terminals of an external circuit board;

each of said bonding pads having a metallized layer formed on said substrate, and further having a Ni—B-plated layer, a Ni—P-plated layer and a Au-plated layer which are formed in this order on said metallized layer, said Au-plated layer having the thickness ranging from 1.2 to 3.5 $\mu$m; and each of said external connection terminals having a metallized layer formed on said substrate, and further having a Ni—B-plated layer and a Au-plated layer which are formed in this order on said metallized layer of each of said external connection terminals, said Au-plated layer of each of said external connection terminals having the thickness ranging from 0.01 to 1 $\mu$m.

2. A method of producing a wired board according to claim 1, the method comprising:

(a) plating said metallized layer of each of said bonding pads with Ni—B to form said Ni—B-plated layer on said metallized layer of each of said bonding pads;

(b) plating said metallized layer of each of said external connection terminals with Ni—B to form said Ni—B-plated layer on said metallized layer of each of said external connection terminals;

(c) plating said Ni—B-plated layer of each of said bonding pads with Au to form an intermediate Au-plated layer on said Ni—B-plated layer of each of said bonding pads, wherein said intermediate Au-plated layer has a thickness ranging from 0.01 to 1 $\mu$m;

(d) plating said Ni—B-plated layer of each of said external connection terminals with Au to form said Au-plated layer on said Ni—B-plated layer of each of said external connection terminals, wherein said Au-plated layer has a thickness ranging from 0.01 to 1 $\mu$m;

(e) after said operation (d), masking said external connection terminals;

(f) removing said intermediate Au-plated layer formed on said Ni—B-plated layer of each of said bonding pads while said external connection terminals are masked;

(g) after said operation (f), plating said Ni—B-plated layer of each of said bonding pads with Ni—P to form said Ni—P-plated layer on said Ni—B-plated layer of each of said bonding pads; and (h) plating said Ni—P-plated layer of each of said bonding pads with Au to form said Au-plated layer on said Ni—P-plated layer of each of said bonding pads, wherein said operation (h) is performed while said external connection terminals are masked and wherein said Au-plated layer has a thickness ranging from 1.2 to 3.5 $\mu$m.

* * * * *